United States Patent [19]

Bar-On

[11] Patent Number: 4,652,693

[45] Date of Patent: Mar. 24, 1987

[54] REFORMED FRONT CONTACT CURRENT COLLECTOR GRID AND CELL INTERCONNECT FOR A PHOTOVOLTAIC CELL MODULE

[75] Inventor: Ari Bar-On, Shaker Heights, Ohio

[73] Assignee: The Standard Oil Company, Cleveland, Ohio

[21] Appl. No.: 771,280

[22] Filed: Aug. 30, 1985

[51] Int. Cl.$^4$ ............................................. H01L 25/02
[52] U.S. Cl. ..................................... 136/251; 136/244; 136/245; 136/256
[58] Field of Search ................. 136/244, 251, 256, 245

[56] References Cited

U.S. PATENT DOCUMENTS

| | | | |
|---|---|---|---|
| Re. 25,647 | 9/1964 | Mann et al. | 136/244 |
| 3,116,171 | 12/1963 | Nielsen et al. | 136/245 |
| 3,442,007 | 5/1969 | Griffin | 228/179 |
| 3,483,038 | 12/1969 | Hui et al. | 136/244 |
| 4,084,985 | 4/1978 | Evans, Jr. | 136/251 |
| 4,260,429 | 4/1981 | Moyer | 136/256 |
| 4,336,648 | 6/1982 | Pschunder et al. | 29/572 |
| 4,348,546 | 9/1982 | Little | 136/256 |
| 4,409,605 | 10/1983 | Ovshinsky et al. | 357/2 |
| 4,525,594 | 6/1985 | Pschunder | 136/256 |
| 4,577,051 | 3/1986 | Hartman | 136/244 |

FOREIGN PATENT DOCUMENTS 59-115576 7/1984 Japan ..................... 136/244

OTHER PUBLICATIONS

"An Alternative to the 'Five Year Research Plan . . . 1984-1988 . . . Photovoltaics: Electricity from Sunlight'. . . U.S. Department of Energy, May 1983", The Grindelwald Letter, Mar. 1984 edition (Eleventh in a series), published by Alfred H. Canada, Mammoth Lakes, California.

Primary Examiner—Aaron Weisstuch
Attorney, Agent, or Firm—Jeffrey A. Wyand; Joseph G. Curatolo; Larry W. Evans

[57] ABSTRACT

A photovoltaic array module incorporating a plurality of photovoltaic cell strips (11). Each cell strip (11) incorporates an electrically conductive substrate layer (21), a semiconductor body (22) deposited on the substrate layer (21), and a transparent electrically conductive layer (23) deposited on the semiconductor body (22). Each cell strip (11) further incorporates a preformed thin-film unitary grid and interconnect structure (20) electrically associated with the transparent electrically conductive layer (23) thereof so as to collect and remove electrical current therefrom and electrically to interconnect the cell strips (11). A first busbar (12) and a second busbar (13) are connected to the end cell strips (11) of the array to collect the electrical energy generated thereby.

15 Claims, 6 Drawing Figures

REFORMED FRONT CONTACT CURRENT COLLECTOR GRID AND CELL INTERCONNECT FOR A PHOTOVOLTAIC CELL MODULE

TECHNICAL FIELD

The present invention relates generally to a photovoltaic cell module. More particularly, the present invention relates to a large area cell module encompassing a plurality of individual photovoltaic cell strips. Specifically, the present invention pertains to a cell module wherein the individual cell strips have front contact current collector grids each having integral cell interconnects. The present invention further relates to a bypass diode circuitry incorporated into the grid and interconnect structures.

BACKGROUND ART

With the increasing cost of conventional energy sources, such as coal, oil, and natural gas, attention has been directed to harnessing solar energy. Substantial gains have been made in the development of photovoltaic technology, but the cost per unit of usable energy continues to be excessive. Contributing factors of such high cost are found in the cost of production of photovoltaic devices, primarily, cost of material and man-hours for assembly, maintenance costs and reliability of extended performance.

Advances in the development of the photovoltaic cell itself have been forthcoming. Indeed, the production of amorphous solar cells, such as amorphous silicon cells, has reduced considerably the material cost of photovoltaic assemblies. For a more detailed discussion regarding the development of amorphous solar cells, reference may be made to U.S. Pat. No. 4,409,605, to Ovshinsky et al.

An inherent problem with any type of solar cell involves the collection of electrical energy from the solar cell itself. Particularly, the electrical connection to the surface exposed to solar radiation is of major concern. This is so because any electrical collector means must ideally exhibit good electrical conductivity with high solar radiation transparency. Unfortunately, these two parameters are not found in any one material which is economical to solar cell production. As such it has been necessary to employ at least two distinct electrical conductor means to collect the electrical energy from the solar cell.

One arrangement normally employed in solar cell design involves a transparent conductive oxide (TCO) layer, such as indium tin oxide or indium oxide, layered over the top layer—either P or N type—of the semiconductor region of the solar cell. The TCO layer permits the influx of solar radiation into the semiconductor region while providing an electrical path therefrom. However, the electrical resistivity of the TCO layer is not suitable for current collection over large surface areas, i.e., greater than approximately 2 cm$^2$. To remedy this problem, it is necessary to provide front contact electrical conductor grids of lower electrical resistance adjacent to, and electrically communicating with, the TCO layer to receive the electrical current therefrom.

Several techniques are presently employed for fabricating the front contact grid of photovoltaic cells. These techniques involve the fabrication of the grid directly onto the transparent conductive layer of the cell. Exemplary of this in situ fabrication of the grids are screen printing with conductive ink, and electroform plating using a mask to form a preselected pattern. These techniques, in addition to being time consuming from a production aspect, present inherent problems in the fabrication of photovoltaic cells. To begin with, the material costs for conductive inks—such as silver ink—are high. Furthermore, the grids thus formed are not readily electrically interconnected when multiple cells are assembled into a photovoltaic array. The small area of the grids, coupled with the material used, for example silver ink for screen printing, precludes favorable soldering or welding of the interconnectors to the grid.

Efforts have been made to form front contact current collector grids by methods other than in situ fabrication. Exemplary of these efforts is U.S. Pat. No. 4,348,546 to Little wherein a mesh of fine wires are encapsulated between a transparent cover plate and the front surface of the semiconductor strata during fabrication of the solar cell. Use of the fine wire as a front contact current collector for solar cells is also discussed in "An Alternative to the 'Five Year Research Plan . . . 1984-1988 . . . Photovoltaics: Electricity from Sunlight' . . . U.S. Department of Energy, May 1983", The Grindelwald Letter, March 1984 edition (Eleventh in a series), published by Alfred H. Canada, Mammoth Lakes, Calif.

The use of the interconnectors, themselves, is not without inherent problems. Particularly, the interconnectors employed are highly susceptible to mechanical and thermal stresses experienced by the solar module. Indeed, the normal handling of the solar module during fabrication, installation and maintenance may easily damage the electrical connection network. In addition, the cyclic temperature change which the solar module experiences, as it is exposed to periods of sunlight and periods of darkness, causes thermally induced stresses in the electrical interconnectors which may ultimately result in fatigue failures thereof.

Efforts to remedy these stress problems have resulted in the general acceptance of electrical interconnectors of substantial size which are more resistant to the stress loadings. However, the larger size of the interconnectors causes increased shadowing of the solar cells in those areas where they overlay, thereby detrimentally reducing the output of electrical energy from the solar cell. To avoid such optical obscuration losses caused by the shadowing effect on the solar cell, the electrical interconnectors in some solar cells have been joined to the peripheral edge of the solar cell. Exemplary of this type of cell interconnection is U.S. Pat. No. 4,336,648, to Pschunder et al. However, this too causes detrimental reduction in the electrical output of the solar cell as current received, by the TCO layer and/or the front contact grid at the distal end from the interconnection junction is required to travel the full width of the solar cell through poorly conductive materials.

In addition to the foregoing problems, the process of accurately locating and securing the electrical interconnectors relative to each individual solar cell in the array is a time consuming process. These production difficulties have been a significant obstacle in the development and commercialization of photovoltaic devices.

Despite the substantial work and research conducted in the production of photovoltaic cells and array modules, no practical solutions have been developed to alleviate the aforesaid problems in fabricating the cells and array modules.

DISCLOSURE OF THE INVENTION

Therefore, an object of the present invention is a photovoltaic module incorporating a busbar and a plurality of individual cell strips. Each cell strip has an electrically conductive substrate layer, a semiconductor body deposited on the substrate layer, and a transparent electrically conductive layer deposited on the semiconductor body. Each cell strip further has a preformed thin-film unitary grid and interconnect structure electrically associated with the transparent electrically conductive layer thereof. Means are provided for connecting the grid and interconnect structure of one cell strip with the busbar. Means are likewise provided for connecting the grid and interconnect structure of one cell strip with the electrically conductive substrate layer of another cell strip.

Another object of the present invention is a preformed thin-film unitary front contact current collector grid and cell interconnect for a photovoltaic module. The grid and interconnect includes a plurality of fingers oriented in a predetermined configuration. A collector bus is integrally associated with the fingers and together therewith defines the current collecting structure of the grid for electrically associating with a photovoltaic cell. Interconnect conductors also are integrally associated with the collector bus.

A preferred embodiment for a photovoltaic module incorporating the concept of the present invention is shown by way of example in the accompanying drawings without attempting to show all the various forms and modifications in which the invention might be embodied, the invention being measured by the appended claims and not by the details of the specification.

EXEMPLARY EMBODIMENT FOR CARRYING OUT THE INVENTION

The concept of a preformed, thin-film front contact current collector grid for photovoltaic cells is disclosed in a copending application, U.S. Ser. No. 771,262, filed Aug. 30, 1985; and, where applicable, the disclosures thereof are incorporated in the present application by reference.

Figure 1:
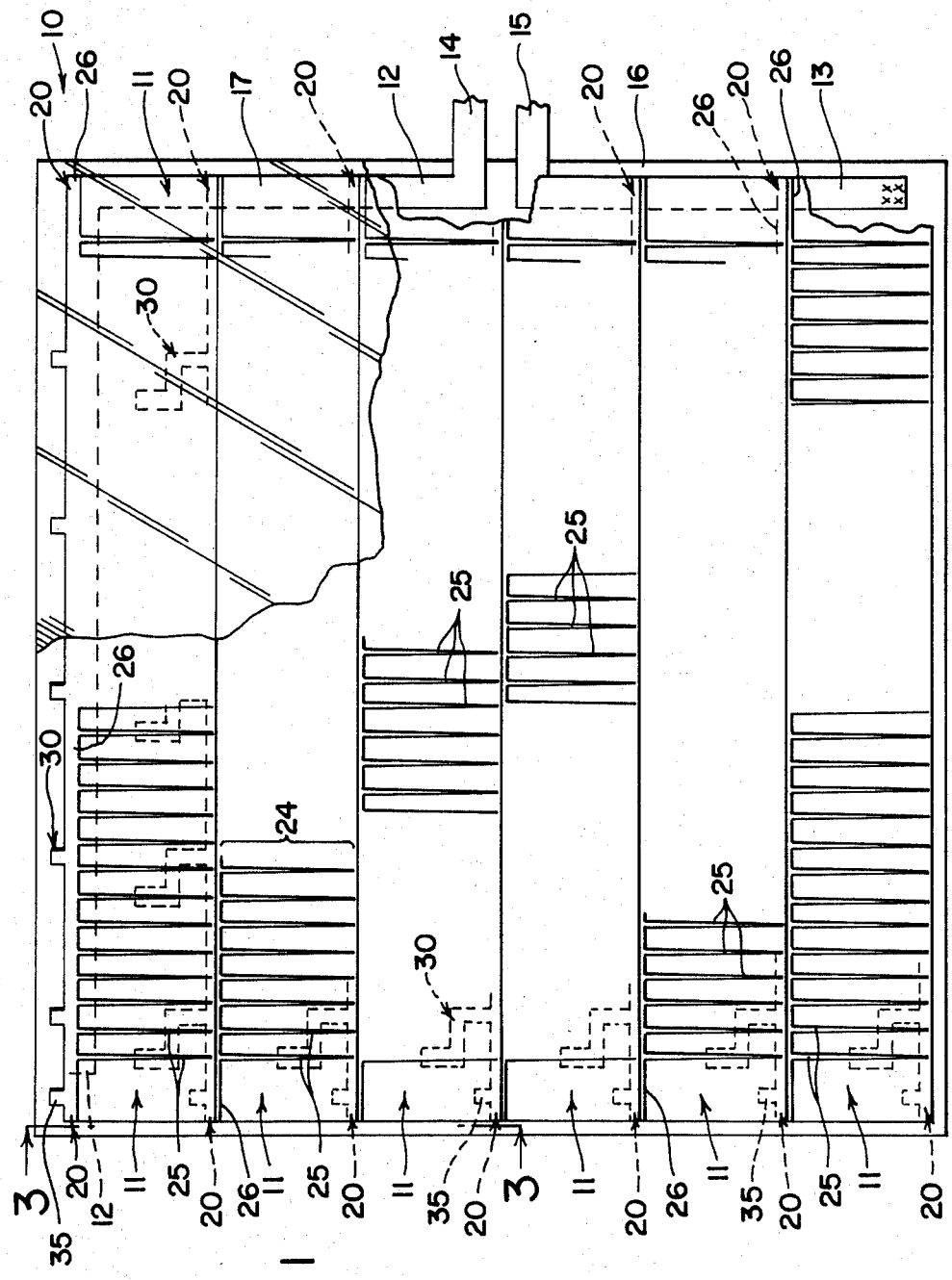
FIG. 1 is a plan view of a photovoltaic cell module embodying the concept of the present invention.

A photovoltaic cell module according to the concept of the present invention is indicated generally by the numeral 10 in FIG. 1 of the accompanying drawings. The photovoltaic module 10 includes a plurality of photovoltaic cell strips 11 electrically joined together in series so as to generate the desired electrical voltage output. A first busbar 12 and a second busbar 13 collect the electrical energy from the photovoltaic cell strips 11 and carry the same to output terminals 14 and 15, respectively, which define the positive and negative terminals of the photovoltaic module 10.

A suitable support member 16 provides physical support for the individual photovoltaic cell strips 11 as well as the busbars 12 and 13 so as to define a workable assembly. While the support member 16 may be a rigid framework, ideally suited for crystalline solar cells, it may also be in the form of a flexible laminated film which enhances the flexible characteristics of amorphous solar cells. Likewise, a transparent glass or plastic protective covering 17 for the module 10 may be employed to offer protection against impact to the face of the cell strips 11. Furthermore, by enveloping the module in a protective covering such as plastic, corrosion protection is imparted to the surface area that would otherwise be exposed. In this respect, TEDLAR ® film developed by duPont Company has been found to offer appropriate protection for the module 10 while remaining substantially transparent to solar energy.

Figure 2:
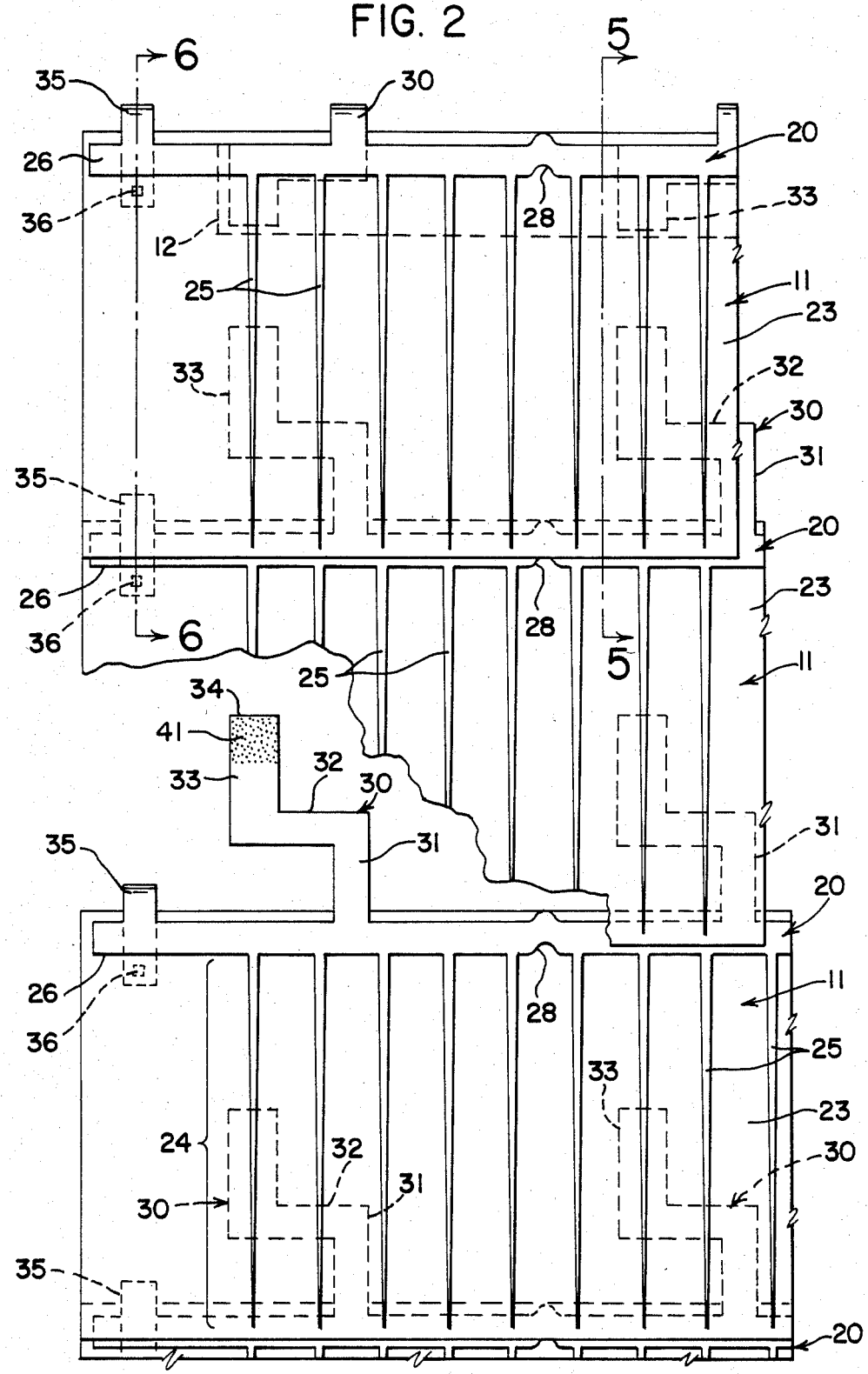
FIG. 2 is an enlarged fragmentary plan view of the photovoltaic cells and grid and interconnect structures, as employed in the photovoltaic cell module depicted in FIG. 1.
Figure 3:
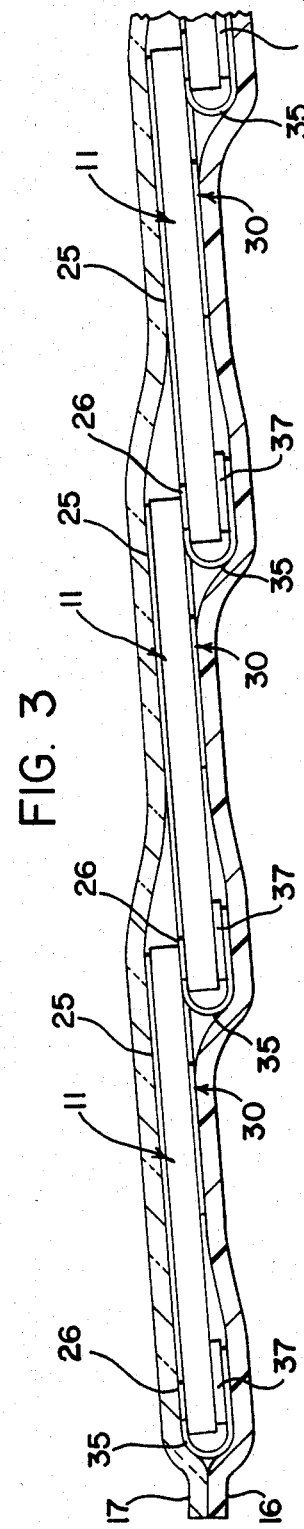
FIG. 3 is a fragmentary cross-section taken substantially along line 3—3 of FIG. 1.

The individual photovoltaic strips 11 and particularly the grid and interconnect structure 20 incorporated therewith, may be more fully considered by referring to FIG. 2 and FIG. 3. The photovoltaic strips 11 are shown laterally positioned in a slightly overlapped, or shingled, relation. The photovoltaic strips 11 are electrically joined in series by grid and interconnect structure 20, as will be discussed more fully hereinbelow. Although depicted in a shingled configuration, it should be appreciated that photovoltaic cell strips 11 may likewise be spaced apart laterally with equally desirable results.

Figure 5:
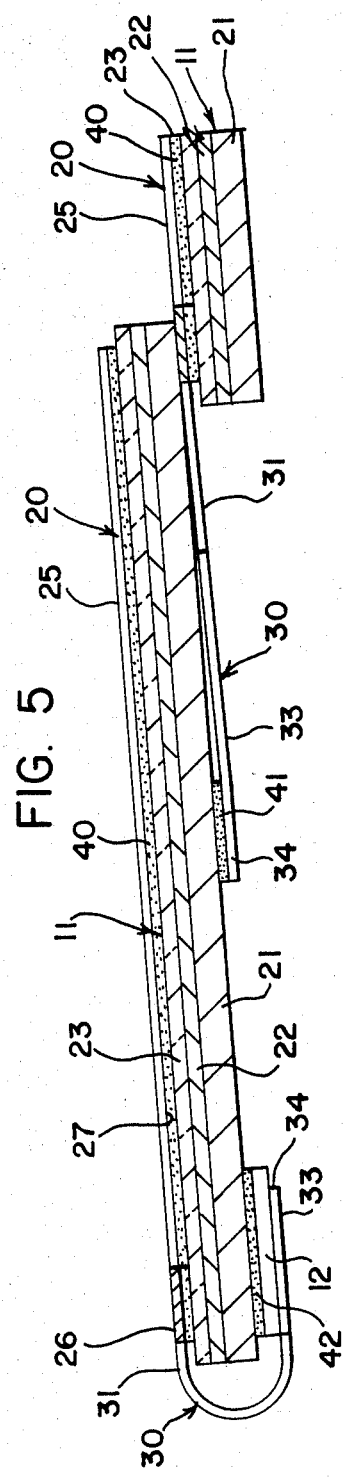
FIG. 5 is an enlarged fragmentary cross-section taken substanially along line 5—5 of FIG. 2; and, FIG. 6 is an enlarged fragmentary cross-section taken substantially along line 6—6 of FIG. 2 and depicting the incorporation of bypass diodes into the photovoltaic cell module.

The structure of the cell photovoltaic strips 11 is shown in FIG. 5. The exemplary strips 11 shown are of the general configuration for amorphous silicon solar cells, although the concept of the present invention is equally applicable to all types of solar cells, including crystalline solar cells, semi-crystalline solar cells and amorphous solar cells. Each cell strip 11 includes an electrically conductive continuous substrate layer 21, which preferably is a flexible metallic member such as stainless steel. A semiconductor body 22 is deposited on the substrate layer 21 in electrical contact therewith. A transparent, electrically conductive layer 23 is deposited on the semiconductor body 22 so as to form an electrical junction therewith. The transparent layer 23 is preferably a thin layer of a transparent conductive oxide, such as indium tin oxide (ITO). It should be noted that FIG. 5 is not prepared to scale but rather is substantially distorted to permit a more detailed representation of the individual elements. As a reference, it should be appreciated that the semiconductor body 22 is typically less than one micron thick, as compared to the substrate layer 21, which is generally 200 to 300 microns thick.

Figure 4:
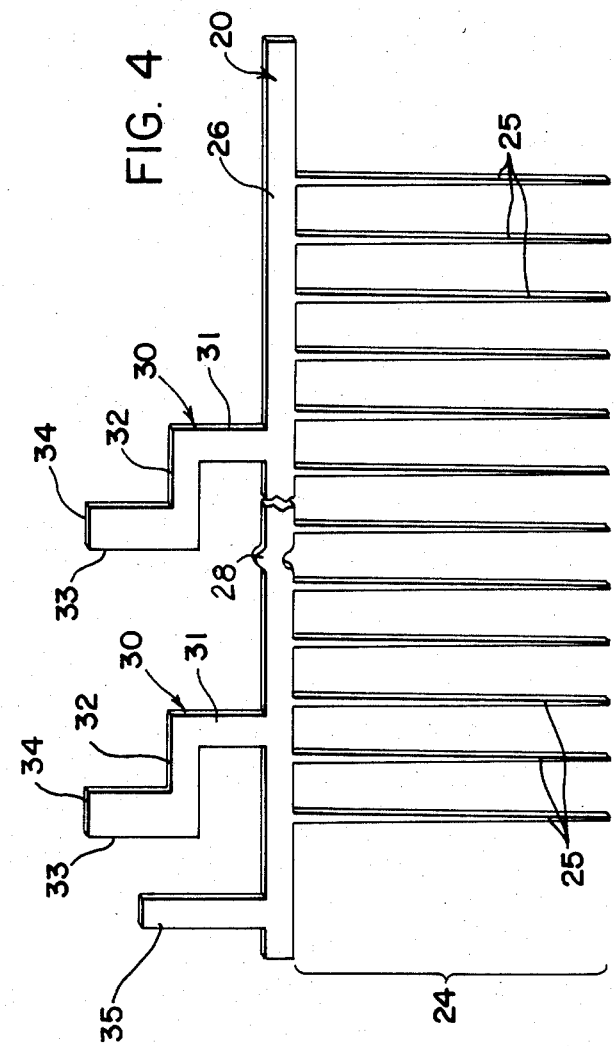
FIG. 4 is an enlarged fragmentary perspective view of a grid and interconnect structure embodying the concept of the present invention as employed in the photovoltaic cell module of FIG. 1.

The specific construction of grid and interconnect structure 20 may be more fully considered by referring to FIG. 4. Grid and interconnect structure 20 is preferably formed from a unitary strip of a highly conductive material, such as a conductive metal or alloy foil—such as, aluminum, copper, silver, gold, brass, etc. Although the exact configuration of grid and interconnect structure may vary to meet the parameters of a specific application, several features generally are common to each as contemplated in the present invention.

Grid and interconnect structure 20 is preferably made of thin-film unitary material, as depicted in FIG. 4. Depending upon the specific material employed, for example, the thickness of the film from which grid and interconnect structure 20 is made is approximately 1 to 3 mils (0.025 to 0.076 mm). This thin-film material is pre-cut to form a unitary structure 20 of the desired configuration, as by a die cutting process for instance, to meet the requirements of the specific application. Generally, grid and interconnect structure 20 has a grid section 24 having a plurality of narrow fingers 25 integrally associated with, and depending from, a common collector bus 26. The fingers 25 and collector bus 26 collectively define the current collector member of grid section 24, which structure presents a contact surface 27 to facilitate electrical communication with transparent conductive layer 23, as depicted in FIG. 5.

Inasmuch as grid and interconnect structure 20 is made from opaque material, such as aluminum, the surface area of grid section 24 must be kept to a minimum so as to reduce losses caused by shadowing of the cell. For the configuration of grid section 24 depicted in FIG. 4, wherein fingers 25 are integrally associated with, and depend in one direction from, collector bus 26, each finger 25 is triangular in shape with the plan width thereof continually decreasing toward the tip. For a cell strip 11 of approximately 1.7 inches (4.3 cm) in width, fingers 25 are preferably 1.5 inches (3.8 cm) in length so as to extend sufficiently across the width of cell strip 11. The maximum plan width of fingers 25, at the juncture thereof with collector bus 26, is approximately 0.020 inch (0.05 cm) and are spaced approximately 0.24 inch (0.61 cm) from each other. Similarly, collector bus 26 preferably has a plan width of approximately 0.188 inch (0.47 cm). Other dimensional parameters, of course, are contemplated. Determinative factors defining the physical parameters of grid and interconnect structure 20 include the junction type of the cell—single junction, tandem junction, etc.—the voltage potential of the cell and the ideal resistance of the grid and the transparent conductive layer.

The configuration of grid section 24 provides several significant advantages. Collector bus 26 is capable of being located proximate an edge of a photovoltaic cell, as will be appreciated hereinbelow. Furthermore, the tapered configuration of fingers 25 permits uniform current density to exist throughout fingers 25. As the current flows toward collector bus 26, the accumulation of current from the cell strip 11 will necessitate a larger conductor path than is required at the most distal end of finger 25. Accordingly, the tapered configuration of fingers 25 provides ample current carrying capacity throughout their length while providing minimal surface area so as to reduce losses due to shadowing of the cell strip 11.

Collector bus 26 may also include stress reliefs 28 along the length thereof. Generally, these stress reliefs 28 are distressed portions of the material from which grid and interconnct structure 20 are formed so as to relieve thermal stresses. It should be appreciated that grid and interconnect structure 20 may be formed of a material having a coefficient of thermal expansion different than that of cell strip 11. Accordingly, throughout temperature fluctuations, stresses may arise in collector bus 26 because of different expansion rates. Stress reliefs 28 permit dissipation of such stresses without causing a structural failure in collector bus 26 or in the mechanical, electrical bond with transparent layer 23.

The exact number and location of stress reliefs 28 incorporated in collector bus 26 will depend on the specific application, although it has been found beneficial to space stress reliefs 28 approximately 2 inches (5.08 cm) apart along the length of collector bus 26.

Grid and interconnect structure 20 also includes integral interconnect tabs 30 depending from collector bus 26 opposite of fingers 25. Each interconnect tab 30 is generally a Z-shaped conductor having a base leg 31 extending substantially perpendicular to collector bus 26. An intermediate leg 32 depends perpendicular from base leg 31 and generally has a smaller cross-section than base leg 31. End leg 33 depends perpendicular to intermediate leg 32, and parallel to base leg 31. End leg 33 defines a contact region 34 for securement to an electrical conductor as will be discussed hereinbelow. It should be appreciated that interconnect tab 30 defines a highly flexible conductor. Particularly, the smaller cross section of intermediate leg 32 permits interconnect tab 30 to yield to mechanical loads which it may experience, as will be appreciated hereinbelow.

A further appurtenance of grid and interconnect structure 20 is a diode conductor 35 which, as with interconnect tabs 30, depends from collector bus 26. Diode conductor 35 is of sufficient length to permit it to interconnect with a bypass diode 36 on the substrate layer 21 of the cell strip 11 while grid section 24 is secured to transparent layer 23 thereof, as will be more fully discussed hereinbelow.

With grid and interconnect structure 20 being fabricated independently of a cell strip 11, operative association of grid section 24 with transparent layer 23 is achieved through the use of a conductive adhesive 40. Conductive adhesive 40 is disposed between grid section 24 and transparent layer 23, thereby bonding the former to the latter. Preferably, conductive adhesive 40 is a hot-melt type adhesive although other types of adhesives may be employed. Likewise, adhesive 40 preferably has a bulk resistivity of approximately 2 ohms-cm for use with a cell having a voltage of approximately 1.3 volts, although a broader range of from about 0.5 to 5 ohms-cm is believed to be operable for other voltages which photovoltaic cells are known to operate. At least one suitable conductive adhesive is a carbon loaded, polyimide, hot-melt adhesive.

It should be appreciated that with grid section 24 thus affixed to transparent conductive layer 23 with adhesive 40, good electrical communication exists therebetween. Electrical current generated by cell strip 11, therefore, is collected from transparent conductive layer 23 by grid section 24, in the same manner as prior art grids.

The individual cell strips 11 are electrically interconnected by interconnect tabs 30 as indicated above. With more specificity, and referring to FIG. 2 and FIG. 5, the electrical interconnections embodied in the instant disclosure can be considered.

Referring to FIG. 2, as it depicts a series connection between successive strips, the transparent conductive layer 23 of one cell strip 11 is joined to the substrate layer 21 of a next adjacent cell strip 11 using interconnect tabs 30. Namely, the cell strips 11 are partially overlapped in a shingled configuration such that substrate layer 21 of one cell strip 11 is positioned over conductive bus 26 of the next adjacent cell strip 11, as depicted in FIG. 5. Interconnect tab 30 is secured, at contact region 34, to substrate layer 11 of the adjacent cell strip 11. Securement can be effected in a variety of manners, provided good electrical intercommunication is achieved between substrate layer 21 and interconnect tab 30. To this end, when substrate layer 11 is stainless steel and grid and interconnect structure 20 is a compatible metal, such as aluminum, securement can be achieved through spot welding or soldering. Securement can likewise be achieved using a conductive adhesive 41, such as a conductive acrylic transfer adhesive made by Chomerics, Inc., Hudson, N.H., which further facilitates commercial production of photovoltaic array modules.

It should be appreciated that interconnect tabs 30 provide ample flexibility to permit successive cell strips 11 to move relative to each other without failure of the tabs. Because the tabs 30 are restrained only where they depend from collector bus 20 and contact region 34, movement between successive cell strips 11 causes intermediate leg 32 to deflect slightly, thereby preventing stress that would cause a failure of interconnect tab 30. It should also be appreciated, therefore, that it is preferable that interconnect tab 30 be of sufficient length such that contact region 34 is proximate to the mid-line of the cell strip 11 to which it is connected. This allows for greater flexibility of interconnect tab 30, thereby further reducing stress therein. This also provides a more uniform current distribution throughout the cell strip 11 when interconnected with other cell strips 11.

It should be noted that each grid and interconnect structure 20 employs a plurality of interconnect tabs 30. The exact number of interconnect tabs 30 per cell strip 11 may vary according to the requirements of a specific application. It is preferable that a plurality of interconnect tabs 30 be employed for each cell strip 11 as this provides for desirable redundancy of interconnection and it also reduces $I^2R$ losses from the grid and interconnect structure 20. If one interconnect tab 30 should break or otherwise lose contact with substrate layer 21, electrical current from grid section 24 will readily flow through the other interconnect tabs 30, thereby maintaining a complete conductor path between successive cell strips 11. An acceptable parameter for locating the interconnect tabs 30 is to space them approximately 12 inches (30.5 cm) from each other throughout the length of the cell strip 11.

FIG. 5 also depicts the electrical connection between the transparent layer 23 of the final cell strip 11 of the series array with the first busbar 12. The overall characteristics of this interconnection are identical to the interconnection between successive strips 11. The only difference is that busbar 12 replaces the next adjacent strip in the series and is doubled back under, and secured to, the final strip 11. Particularly, busbar 12 is secured to substrate layer 21 of strip 11 with an insulating adhesive tape 42, or similar insulating medium, so as to avoid any electrical short circuits therebetween. Interconnect tabs 30 extend from collector bus 26 on the top of cell strip 11 and contact region 34 of interconnect tabs 30 are secured to busbar 12. Securement of contact region 34 to busbar 12 is achieved in the manner described hereinabove with respect to securement to substrate layers 21.

Electrical interconnection between the transparent layer 23 of the final cell strip 11 and first busbar 12 can be achieved in other manners than that described hereinabove. For example, busbar 12 can be secured directly to a grid on transparent layer 23 or other less flexible interconnects may be employed to connect the grid to the first busbar 12. This is acceptable because first busbar 12 generally does not move relative to the cell strip 11. The use of grid and interconnect structure 20, however, does provide for uniformity and standardization in the production aspect of photovoltaic array modules, inasmuch as the same type of grid and interconnect structure 20 is employed throughout the array module 10.

Figure 6:
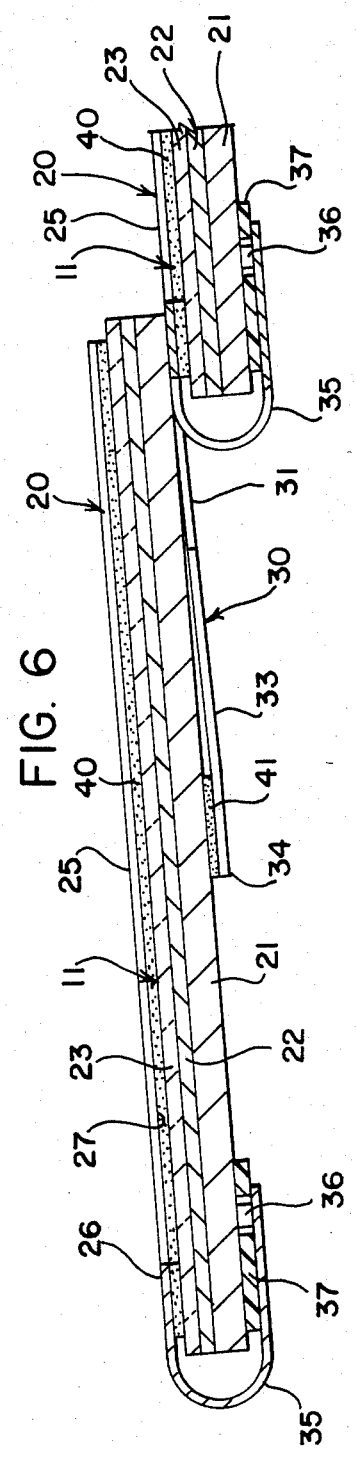

Bypass diodes 36 are incorporated into the series array using diode conductor 35. Referring to FIG. 6, with grid and interconnect structure 20 positioned on a cell strip 11, diode conductor 35 is folded under the same cell strip 11. Bypass diode 36, which is preferably a wafer or chip diode, is interposed between diode conductor 35 and substrate layer 21, thereby defining a substantially unidirectional flow path therebetween. An insulator 37 is incorporated around bypass diode 36 to prevent electrical short circuiting between diode conductor 35 and substrate layer 21. As is appreciated by one skilled in photovoltaics, this arrangement permits the array module 10 to maintain generating substantial electrical current even though one cell strip 11 may be completely shadowed, thereby acting as an electrical resistor. Current generated by the other cell strips 11 will flow, instead, through diode 36 and diode conductor 35 to the next cell strip via interconnect tab 30, and thus bypass the shadowed cell strip 11.

The advantages of the disclosed photovoltaic module 10 may be better appreciated by considering an exemplary model incorporating the teachings herein. In particular, reference is made to a module 10 incorporating amorphous silicon solar cells and having a total power output of 57 watts and a nominal voltage of 12 volts, direct current (D.C.).

The individual strips 11 are approximately 5 centimeters (1.97 inches) wide by 120 centimeters (47.24 inches) long. The output of each strip 11 is approximately 1.2 volts, D.C., and 3.96 amperes of current when exposed to sunlight, under AM-1 conditions.

Using the above disclosed electrical interconnections, a total of twelve strips 11 were electrically joined together in series to form the module 10. As would be appreciated by one knowledgeable in electrical circuits, such a series interconnection permits an aggregation of the voltage output from each cell strip 11 while maintaining a constant current. As such, the electrical output of the module 10 is approximately 14.4 volts, D.C., and 3.96 amperes; and, thus a power output of approximately 57 watts is attainable.

The operation of the foregoing module 10 is exemplary of the instant disclosure. Electrical power generated by each cell strip 11, as a result of its exposure to an activating light source, is collected from transparent layer 23 by grid section 24, via conductive adhesive 40, and directed to collector bus 26 thereof. This electrical energy is received by interconnect tabs 30 and transferred thereby to substrate layer 21 of the next adjacent strip 11 through the electrical junction formed at contact region 34. This electrical energy is conducted through the next adjacent cell strip 11 and combined with the electrical output therefrom. This process continues throughout the entire module 10 until the final strip 11 transfers the accumulated electrical energy to first busbar 12 via interconnect tabs 30. Busbar 12 carries the electrical energy to output terminal 14 where a voltage differential with output terminal 15 is defined. This is so because terminal 15 is electrically connected with substrate layer 21 of the first in the series of strips 11 via second busbar 13.

The foregoing module 10 has been found to exhibit superb flexibility and resistance to stresses. Furthermore, when combined with a flexible backing material and a transparent protective overlayer, the foregoing module 10 permits ease of handling during installation and is capable of assuming the contour of a variety of support structures with no detrimental effect. Indeed, the module 10 so embodied is able to be rolled up for ease of transportation and then unfurled for installation.

In view of the foregoing disclosure, it should be evident that a photovoltaic module embodying the concept of the invention disclosed herein provides desirable characteristics in the structure and fabrication of photovoltaic array modules. The disclosed invention enables a photovoltaic array module to be constructed with a unitary grid and interconnect structure that not only collects electrical current from a cell strip but also electrically interconnects that cell strip with another cell strip, or other conductor. Furthermore, the mechanical interconnections achieved by the grid and interconnect structure exhibit substantial resistance to stresses caused by mechanical loading and temperature variations, while also providing superb flexibility to the overall module. Manufacture of the disclosed invention is greatly simplified because the grid and interconnect structure eliminates the need for costly silk screened or electroform plated grids and the tedious and delicate procedure of making acceptable electrical interconnections with the grid. As such, the foregoing invention should be recognized as constituting a new, novel and advantageous contribution to the art.

I claim:
1. A photovoltaic module comprising:
   a plurality of individual photovoltaic cell strips, each said cell strip having an electrically conductive substrate, a semiconductor body deposited on said substrate, and a transparent electrically conductive layer deposited on said semiconductor body;
   unitary grid and interconnect means for collecting current from a said strip and interconnecting adjacent ones of said strip, including a current collecting grid section and an interconnector said unitary grid and interconnect means including a current collecting bus, said grid section comprising a plurality of fingers extending from said bus, said interconnector extending from said current collecting bus;
   an electrically conductive adhesive disposed between and electrically connecting said grid to said transparent electrically conductive layer; and,
   means for electrically connecting said interconnector of one of said cell strips to said electrically conductive substrate of an adjacent one of said cell strips.
2. The photovoltaic module according to claim 1, wherein said grid and interconnect means is a conductive metal foil.
3. The photovoltaic module according to claim 1, wherein said photovoltaic cell strips partially overlap each other in a shingle-like arrangement.
4. The photovoltaic module according to claim 1, further comprising support member means for physically positioning said photovoltaic cell strips relative to each other.
5. The photovoltaic module according to claim 4, further comprising transparent protective cover means for enveloping said photovoltaic cell strips.
6. The photovoltaic module according to claim 1, further comprising means for conditionally electrically bypassing said cell strip.
7. The photovoltaic module according to claim 6, wherein said means for conditionally bypassing comprises a diode conductor extending from said bus, and diode means electrically interposed between said substrate of one of said cell strips and said diode conductor of the same said cell strip.
8. The photovoltaic module according to claim 1 including first stress relief means integral with said current collecting bus for relieving thermal stresses in said bus.
9. The photovoltaic module according to claim 8, wherein said first stress relief means comprises at least one distressed portion of said current collecting bus transverse to said fingers.
10. The photovoltaic module according to claim 1, comprising a second stress relief means integral with said interconnector for relieving mechanical stress, said second stress relief means having a base leg extending substantially perpendicularly to said current collecting bus, an intermediate leg depending perpendicularly from said base leg, and an end leg depending perpendicularly from said intermediate leg and having thereon said contact region.
11. The photovoltaic module of claim 1 wherein said electrically conductive adhesive has a bulk resistivity of from about 0.5 ohm-cm to about 5 ohm-cm.
12. A preformed unitary front contact current collector grid and cell interconnect for electrically interconnecting photovoltaic cells in a module including bypass diodes comprising:
   a plurality of finger means for conducting electrical current, said finger means being oriented in a predetermined configuration;
   collector bus means for collecting said electrical current, said finger means depending from said collector bus means;
   integrally formed interconnect conductor means for electrically interconnecting said photovoltaic cells, said interconnect conductor means having at least one interconnect tab depending from said collector bus means, and having a contact region;
   first stress relief means integral with said collector bus means relieving thermal stresses therein; and
   diode conductor means for electrically interposing a bypass diode between photovoltaic cells said diode conductor means depending from said collector bus means.
13. The grid and cell interconnect according to claim 12, wherein said finger means and collector bus means are formed of a metal foil.
14. The grid and cell interconnect according to claim 12, wherein said first stress relief means comprises at least one distressed portion of said collector bus means.
15. The grid and cell interconnect according to claim 14, comprising a second stress relief means integral with said interconnect tab, said second stress relief means having a base leg extending substantially perpendicularly to said collector bus means, an intermediate leg depending perpendicularly from said base leg, and an end leg depending perpendicularly from said intermediate leg and having thereon said contact region.

* * * * *